(12) United States Patent
Seven

(10) Patent No.: US 9,054,656 B2
(45) Date of Patent: Jun. 9, 2015

(54) OUTPUT COUPLING CAPACITOR FREE AUDIO POWER AMPLIFIER DYNAMICALLY CONFIGURED FOR SPEAKERS AND HEADPHONES WITH EXCELLENT CLICK AND POP PERFORMANCE

(71) Applicant: Texas Instruments Incorporated, Dallas, TX (US)

(72) Inventor: Kazim Seven, San Jose, CA (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 169 days.

(21) Appl. No.: 13/925,941

(22) Filed: Jun. 25, 2013

(65) Prior Publication Data

US 2013/0293302 A1    Nov. 7, 2013

Related U.S. Application Data

(62) Division of application No. 13/486,186, filed on Jun. 1, 2012, now Pat. No. 8,493,140, which is a division of application No. 11/656,588, filed on Jan. 22, 2007, now Pat. No. 8,194,892, which is a division of application No. 09/696,866, filed on Oct. 25, 2000, now Pat. No. 7,167,569.

(51) Int. Cl.
*H04R 5/033*     (2006.01)
*H03F 3/45*      (2006.01)
*H04R 5/04*      (2006.01)
*H03F 3/185*     (2006.01)

(52) U.S. Cl.
CPC ............ *H03F 3/45179* (2013.01); *H04R 5/033* (2013.01); *H04R 5/04* (2013.01); *H04R 2420/05* (2013.01); *H03F 3/45071* (2013.01); *H03F 3/185* (2013.01)

(58) Field of Classification Search
CPC .. H04R 5/033; H04R 1/1041; H04R 2420/07; H04R 5/04; H04R 1/1016; H04R 27/00; H04R 2217/03; H04R 3/12; H04R 5/027; H04R 3/00; H04R 3/005; H04R 1/1033; H04R 1/1091; H04R 2201/107; H04R 2420/05; H04R 3/04; H04S 3/00; H04S 7/307; H04S 7/308; H01B 9/003; H01F 2038/146; H01F 38/14
USPC ......... 381/26, 74, 77, 85, 111, 120, 122, 123; 439/668–669
See application file for complete search history.

(56) References Cited

U.S. PATENT DOCUMENTS 5,161,198 A * 11/1992 Noble ............................ 381/81
6,069,960 A *  5/2000 Mizukami et al. ............. 381/74

*Primary Examiner* — Khanh V Nguyen
(74) *Attorney, Agent, or Firm* — Alan A. R. Cooper; Frank D. Cimino

(57) ABSTRACT

First and second channel bridge amplifiers are dynamically configured to drive either speakers or headphones. The first channel bridge amplifier includes a first amplifier driving one end of a first speaker through a mechanical switch in a headphone-jack, and a second amplifier driving another end of the first speaker. The second channel bridge amplifier includes third and fourth amplifiers driving respective ends of a second speaker. An amplifier control circuit dynamically detects the insertion or removal of a plug in the jack and configures the amplifiers accordingly. When a plug is inserted into the jack, the mechanical switch disconnects the first speaker from the first amplifier, and the fourth amplifier is tri-stated disconnect the second speaker. The first and third amplifiers are configured to drive the first and second channels of the headphones, while the third amplifier drives the headphone common point (shield ring) as a virtual ground connection.

6 Claims, 9 Drawing Sheets

OUTPUT COUPLING CAPACITOR FREE AUDIO POWER AMPLIFIER DYNAMICALLY CONFIGURED FOR SPEAKERS AND HEADPHONES WITH EXCELLENT CLICK AND POP PERFORMANCE

This application is a division of application Ser. No. 13/486,186, filed Jun. 1, 2012, entitled "OUTPUT OUPLING CAPACITOR FREE AUDIO POWER AMPLIFIER DYNAMICALLY CONFIGURED FOR SPEAKERS AND HEADPHONES WITH EXCELLENT CLICK AND POP PERFORMANCE", which is a division of application Ser. No. 11/656,588, filed Jan. 22, 2007, entitled "OUTPUT OUPLING CAPACITOR FREE AUDIO POWER AMPLIFIER DYNAMICALLY CONFIGURED FOR SPEAKERS AND HEADPHONES WITH EXCELLENT CLICK AND POP PERFORMANCE", which is a division of application Ser. No. 09/696,866 filed on Oct. 25, 2000, entitled "OUTPUT OUPLING CAPACITOR FREE AUDIO POWER AMPLIFIER DYNAMICALLY CONFIGURED FOR SPEAKERS AND HEADPHONES WITH EXCELLENT CLICK AND POP PERFORMANCE" (now U.S. Pat. No. 7,167,569), all of which are hereby incorporated by reference in their entireties for all purposes.

FIELD OF THE INVENTION

The present invention relates to a method and apparatus for an audio power amplifier that eliminates the use of a coupling capacitor on an output of the amplifier. In particular, the present invention relates to a method and apparatus that eliminates the use of a coupling capacitor on the output of an audio power amplifier and tri-states circuits during power up transients. When certain other circuits become active, the first edge of the input signal is detected and the circuits are enabled. The output of the amplifier is suitable for speakers and headphones. By insuring no current path through the speakers or headphones during the power up transients, excellent click and pop performance is achieved.

BACKGROUND OF THE INVENTION

An audio amplifier that operates from a single power supply is shown in FIG. 1A. The audio amplifier consists of a first operation amplifier (Amp1), a second operational amplifier (Amp2), a input coupling capacitor (CIN), a first resistor R1, a second resistor (R2), and third resistor (R3), a fourth resistor (R4), a fifth resistor (R5), a sixth resistor (R6), and a reference capacitor (CR).

Resistors R5 and R6 are series connected between VHI and GND, forming a resistor divider that produces a reference voltage (VREF). A capacitor CR is connected between VREF and GND, in parallel with resistor R6, to maintain the reference voltage (VREF). The reference voltage is coupled to the non-inverting inputs of amplifiers Amp1 and Amp2.

Amplifier Amp1 produces a first output signal at node OUT−, while amplifier Amp2 produces a second output signal at node OUT+. Amplifier Amp1 is configured as an inverting amplifier, with resistor R2 connected between node V1 and OUT−, and resistor R1 connected between node V1 and VIN. Amplifier Amp2 is configured as an inverting amplifier, with resistor R4 connected between node V2 and OUT+, and resistor R3 connected between node V2 and OUT−. The two amplifiers are arranged in a bridge-amplifier configuration, providing a differential output signal (OUT+, OUT−) across a load such as a speaker (SPK).

The reference voltage (VREF) is necessary to bias the amplifiers in their optimal common mode range, such that a maximum voltage swing is available between the amplifiers output nodes OUT+ and OUT−. Since the amplifiers are biased into their optimal performance range by the reference voltage (VREF), it is necessary isolate the DC level of the input signal from the amplifier. Thus, an ac coupling capacitor (CAC) is connected between the input signal VSIG and the input of the amplifier (VIN).

Before power is applied to the circuit, capacitors CR and CIN have no charge across them (VREF and VIN are at ground). During power up, these capacitors will begin to charge at varying rates, dependent upon the various factors including the input impedance of the amplifiers, the values of the resistors and the size of the input signal VSIG. Since the input signal (VSIG) is varying in time, the differential output of the audio amplifier (OUT+, OUT−) may swing back and forth, crashing against the power supply rails, until the capacitors have charged to their respective final DC values determined by the reference voltage. Once the capacitors have achieved their "steady-state" values, the differential output of the amplifier will operate as a proper audio amplifier. The transient period during power up, where the capacitors are charging and discharging at unequal rates, results in the speaker output producing clicks and pops.

Speakers tend to have very low impedances (on the order of 4 ohms) and require current to drive the speakers. In a single power supply system, bridge amplifiers produce twice the output voltage as compared to single-ended amplifiers. Since power is proportional to the square of the output voltage, twice the output voltage swing corresponds to an increase in power output by a factor of 4. Bridge amplifiers are typically employed to provide higher power output from a single power supply.

A headphone amplifier is shown in FIG. 1B. A phono-plug type jack is used to connect a headphone set (HPA, HPB) to a dual channel amplifier. One channel (A) of the amplifier drives the left headphone (HPA), while another channel (B) drives the right headphone (HPB). Conventional jacks that are used for headphone amplifiers have a shield ring that is connected to a circuit ground, a first connection for the left channel headphone, and a second connection for right channel headphone. A first capacitor couples the output of the channel A amplifier to the left channel headphone (HPA). A second capacitor couples the output of the channel B amplifier to the right headphone (HPB).

Headphones typically have an impedance of 32 ohms, and operate at power levels on the order of 75 mW, which is considerably lower than that required by speakers. Since the output of the amplifiers drive into the headphones with a common ground (GND) connection, it is necessary to couple the output of the amplifiers to the headphones through capacitors. The first and second capacitors prevent loading down the output of the audio amplifiers with a DC load. The coupling capacitors have high values such as, for example, 100 uF.

SUMMARY OF THE INVENTION

Briefly stated, first and second channel bridge amplifiers are dynamically configured to drive either speakers or headphones. The first channel bridge amplifier includes a first amplifier driving one end of a first speaker through a mechanical switch in a headphone-jack, and a second amplifier driving another end of the first speaker. The second channel bridge amplifier includes third and fourth amplifiers driving respective ends of a second speaker. An amplifier control circuit dynamically detects the insertion or removal of a plug in the jack and configures the amplifiers accordingly. When a plug is inserted into the jack, the mechanical switch disconnects the first speaker from the first amplifier, and the fourth amplifier is tri-stated disconnect the second speaker. The first and third amplifiers are configured to drive the first and second channels of the headphones, while the third amplifier drives the headphone common point (shield ring) as a virtual ground connection. The virtual ground connection permits the bridge amplifiers to drive either speakers or headphones without the use of output coupling capacitors. To suppress click and pop, the amplifier control circuit maintains certain amplifiers (depending on headphone or speaker mode) tri-stated until the input coupling capacitors have fully charged and an input signal is detected. In the headphone mode, the driving amplifiers are current limited, the output signal level is automatically attenuated, and the second amplifier is controlled to prevent a ground loop short circuit condition. When a ground short is detected, the second amplifier is tri-stated by the amplifier control circuit.

According to a feature of the invention, an apparatus is provided for automatically determining a type of each load coupled to an amplified A channel signal and an amplified B channel signal and automatically configuring the amplification of the A and B channel signals to drive each determined load type. A first configuration of the amplifiers includes a first amplifier and a second amplifier are arranged to generate an amplified A channel signal between a first output of the first amplifier and a second output of the second amplifier, wherein the first and second outputs are adapted for driving a load of a first type coupled there between, and a third amplifier and a fourth amplifier are arranged to generate an amplified B channel signal between a third output of the third amplifier and a fourth output of the fourth amplifier, wherein the third and fourth outputs are adapted for driving another load of the first type coupled there between. A second configuration of the amplifiers includes the first and second amplifiers are arranged to generate the amplified A channel signal between the first and second outputs, wherein the first and second outputs are adapted for driving a load of a second type coupled there between, and the second amplifier and the third amplifier are arranged to generate the amplified B channel signal between the second output and the third output, wherein the second and third outputs are adapted for driving another load of the second type coupled there between. A control circuit automatically determines the type of loads coupled to the amplified A and B channel signals and automatically employs the determined load type to select an arrangement of the amplifiers in one of the first configuration and the second configuration. The selected arrangement of amplifiers provides an appropriate level for the amplified A and B channel signals to drive their respective loads.

According to a further feature of the invention a first switch couples one of the first and second outputs to the load of the first type when in a closed position. The first switch disconnects the one of the first and second outputs from the load of the first type when in an open position. The control circuit automatically determines the type of load to be of the first type when the first switch is closed and of the second type when the first switch is open. Also, a second switch couples the third output to an input of the control circuit when in a closed position. The second switch disconnects the third output from the input of the control circuit when in an open position. The control circuit detects the type of load by detecting the disposition of the second switch.

According to another feature of the invention, the fourth amplifier may include a tri-state input that is coupled to the control circuit such that the fourth amplifier is enabled when the selected arrangement of the amplifiers in the first configuration. The fourth amplifier is disabled when the selected arrangement is the second configuration.

According to still another feature of the invention, a third switch is employed that couples the first output to an input of the second amplifier when in a closed position, and disconnects the first output from the input of the second amplifier when in an open position. The first switch is controlled by the control circuit such that the third switch is closed when the selected arrangement of the amplifiers in the first configuration, and the third switch is open when the selected arrangement is the second configuration.

According to yet another feature of the invention, the first amplifier and the second amplifier are configured as a bridge amplifier such that the first output and second output provide an A channel differential output, and the third amplifier and the fourth amplifier are configured as another bridge amplifier such that the third output and the fourth output provide a B channel differential output, when the selected arrangement is the first configuration.

According to still another feature of the invention, the second output of the second amplifier provides a virtual ground, the first output of the first amplifier provides an A channel output, and the third output of the third amplifier provides a B channel output, when the selected arrangement is the second configuration.

In one embodiment of the invention, the control circuit is adapted for detecting a disposition of a jack having a mechanical switch. The mechanical switch is disposed in a closed position unless a plug is inserted therein. The mechanical switch is disposed in an open position when a plug is inserted therein. The control circuit determines the disposition of the jack by monitoring the disposition of the mechanical switch.

In another embodiment of the invention, each of the first, second, and the third amplifiers include a controllable current limited output that is enabled in the selected arrangement is the second configuration. Each of the controllable current limited outputs of the first, second, and third amplifiers may include an output transistor that generates an output current in response to a drive signal. A controlled clamp is arranged to clamp the drive signal when the selected arrangement is the second configuration.

In still another embodiment of the invention, the control circuit further comprises a short circuit detector. The short circuit detector determines that a short circuit condition exists when the second output is maintained below the reference voltage for a predetermined time interval. The control circuit disables the second amplifier when the short circuit condition exists.

According to a feature of the invention, a method for dynamically configuring an amplifier with a jack, includes automatically setting a first mode when the jack is empty, and automatically setting a second mode when a plug is inserted in the jack. When in the first mode, a first load coupled between a first output of a first amplifier and a second output of a second amplifier is differentially driven, and a second load coupled between a third output of a third amplifier and a fourth output of a fourth amplifier is also differentially driven. When in the second mode, a series coupled third and fourth load is driven between the first and third outputs, and a ground potential is generated at the second output and coupled through the jack to a common point between the third and fourth loads.

According to another feature of the invention, an apparatus monitors a jack for a plug insertion. The jack includes a first terminal driven by a signal and a second terminal that is separably coupled to the first terminal. The second terminal of the jack is decoupled from the first terminal when a plug is inserted into the jack. A first circuit couples a supply voltage to the second terminal when the plug is in the jack. A compare circuit generates a compare signal responsive to a comparison of the signal to a potential of the second terminal. An enable circuit generates an enable signal when the signal is determined to be different from the supply voltage by a predetermined amount. A memory circuit stores the compare signal when enabled by the enable signal such that the memory circuit produces an output signal indicating the disposition of the plug in the jack. Also, the first circuit includes a transistor that is biased to provide a path between the power supply voltage and the second terminal.

In one embodiment of the invention, the enable circuit may further include a first reference voltage circuit and a first comparator circuit. The first reference voltage circuit that generates a first reference voltage that is different from the power supply voltage by a predetermined amount. The first comparator circuit compares the signal to the first reference voltage to generate an enable signal, the enable signal indicating that the signal different from the power supply voltage by at least the predetermined amount.

In another embodiment of the invention, the compare circuit produces a first output when the potential of the signal is the same as the potential of the second terminal, and the compare circuit produces a second output when the potential of the signal is different from the potential of the second terminal.

According to a feature of the invention, a method of monitoring a jack for a plug insertion is provided for. The jack includes a first terminal driven by a signal and a second terminal that is separably coupled to the first terminal. The second terminal of the jack is decoupled from the first terminal when a plug is inserted into the jack. The method includes coupling the second terminal to a power supply voltage when the jack is inserted, generating a compare signal responsive to a comparison of the signal to a potential of the second terminal, and storing the compare signal in a memory when the signal is different from the power supply voltage by a predetermined amount.

According to another feature of the invention, an apparatus monitors a jack for a plug insertion. The jack includes a first terminal driven by a signal and a second terminal that is separably coupled to the first terminal. The second terminal of the jack is decoupled from the first terminal when a plug is inserted into the jack. The apparatus includes means for coupling the second terminal to a power supply voltage when the jack is inserted, means for generating a compare signal responsive to a comparison of the signal to a potential of the second terminal, and means for storing the compare signal in a memory when the signal is different from the power supply voltage by a predetermined amount.

According to still another feature of the invention, an apparatus for automatically disabling amplification of a signal until steady state amplification is available includes: a first amplifier, a second amplifier, a reference circuit, and a control circuit. The first amplifier includes an input, a reference input and an output, the input is coupled to the signal. The second amplifier includes a reference input, a control input and an output; wherein the outputs of the first and second amplifiers are adapted for driving a load there between. The reference circuit generates a reference voltage that is coupled to the reference inputs of the first and second amplifiers, the reference voltage transitions from a start voltage to a final voltage during a first time period. The control circuit controls the functional operation of the second amplifier. The second amplifier is disabled from providing a return path for the load during the first time period to prevent the introduction of transient effects into the load. When the first time period is over and the signal exceeds a predetermined amount, the control circuit enables the second amplifier to provide steady state amplification of the signal such that transient effects are further minimized into the load.

In one embodiment of the invention, a feedback circuit is coupled between the input and the output of the first amplifier, and the control circuit is arranged to monitor the feedback circuit to determine when the signal exceeds the predetermined amount. The feedback circuit may include a resistor that the control circuit monitors a voltage difference across. The polarity and magnitude of the voltage difference indicates when the signal has exceeded the predetermined amount. Also, a feedback switch may be arranged to couple the input of the first amplifier to the output of the first amplifier when closed. The control circuit is adapted to close the switch during the first time period and open the switch after the first time period.

In another embodiment of the invention, the reference circuit further includes a voltage generator circuit, a controlled current source and a compare circuit. The voltage generator circuit generates a first voltage at a first node. The controlled current source sources a current into a second node when enabled. The compare circuit is arranged to compare the voltage at the first node to a voltage at the second node and produces a control signal having one of a first state and a second state. The first state indicates that the second voltage is substantially different from the first voltage, and the second state indicates that the second voltage is substantially the same as the first voltage. The control signal enables the controlled current source when the control signal is in the first state and disables the controlled current source when the control signal is in the second state. Also, a feedback switch may be arranged to couple the input of the first amplifier to the output of the first amplifier when closed. The control signal from the reference circuit is arranged to close the feedback switch when the control signal is in the first state. The control signal from the reference circuit is arranged to open the feedback switch when the control signal is in the second state.

In accordance with another feature of the invention, an apparatus automatically disables amplification of an input signal until steady state amplification is available. The apparatus includes means for amplifying the input signal to generate a first output, second means for amplifying to generate a second output, the first and second means for amplifying are adapted for driving a load between the first output and the second output, means for generating a reference produces a reference voltage that transitions from a start voltage to a final voltage over a first time period, and means for determining that the reference voltage is the same as the final voltage, indicating an end of the first time period, means for sensing an input signal after the end of the first time period, the means for sensing indicating that the input signal exceeds a predetermined amount, and means for disabling the second means for amplifying until the means for sensing indicates that the input signal has exceeded the predetermined amount after the end of first time period such that the second means for amplifying is prevented from providing a conduction path through the load when the second means for amplifying is disabled.

According to still another feature of the invention, a method automatically disables amplification of an input signal until steady state amplification is available. The method includes: detecting a start-up transient period where a reference voltage is different from a final voltage, disabling a sense circuit during the start-up transient period, monitoring a voltage difference across a feedback resistor with the sense circuit when enabled, the feedback resistor being connected between an input and output of a first amplifier, disabling a second amplifier in the start-up transient period such that there is substantially no conduction path through a load, and enabling the second amplifier after the start-up transient period when the voltage difference across the feedback resistor exceeds a predetermined amount indicating that an input signal is available wherein an amplified signal is only driven through the load after start-up transients have concluded and an input signal is available.

According to yet another feature of the invention, an apparatus automatically disables amplification of a first signal and a second signal until steady state amplification is available. A first amplifier includes an input, a reference input and an output, where the input is coupled to the first signal. A second amplifier includes a reference input, a control input and an output; wherein the outputs of the first and second amplifiers are adapted for driving a load there between. A third amplifier includes an input, a reference input and an output, the input being coupled to the second signal. A fourth amplifier includes a reference input, a control input and an output, wherein the outputs of the third and fourth amplifiers are adapted for driving another load there between. A reference circuit generates a reference voltage that is coupled to the reference inputs of the first, second, third and fourth amplifiers. The reference voltage transitions from a start voltage to a final voltage during a first time period. A control circuit controls the functional operation of the second, and fourth amplifiers, including: disabling the second and fourth amplifiers from providing a return path for each respective load during the first time period to prevent the introduction of transient effects into the respective loads. When the first time period is over and when either one of the first signal and the second signal exceeds a predetermined amount, the control circuit enables the second and fourth amplifiers to provide steady state amplification of the signals such that transient effects are further minimized into the loads.

According to still another feature of the invention, an apparatus provides for automatically disabling amplification of a first signal and a second signal until steady state amplification is available. A first amplifier includes an input, a reference input and an output, the input is coupled to the first signal. A second amplifier includes a reference input, a control input and an output; wherein the outputs of the first and second amplifiers are adapted for driving a load there between. A third amplifier includes an input, a reference input and an output, where the input is coupled to the second signal. A reference circuit generates a reference voltage that is coupled to the reference inputs of the first, second, and third amplifiers. The reference voltage transitions from a start voltage to a final voltage during a first time period. A first switch couples the input of the input of the first amplifier to the input of the third amplifier when closed. A second switch couples the output of the first amplifier to the output of the third amplifier when closed. A control circuit controls the functional operation of the second amplifier, the third amplifier, and the first switch, including disabling the second and third amplifiers and closing the second switch to prevent the load from conducting during the first time period. This prevents the introduction of transient effects into the respective loads. Closing the first switch configures the first amplifier as a summing amplifier during the first time period. When the first time period is over and when either one of the first signal and the second signal exceeds a predetermined amount, the control circuit enables the second and third amplifiers, and opens the first and second switches to provide steady state amplification of the signals such that transient effects are further minimized into the loads.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

The present invention is apparatus and method related to a two-channel amplifier that may be dynamically configured for driving speakers or headphones with a phono-jack. The status of the phono-jack is monitored to determine the proper configuration of the amplifier. By providing a suitable circuit and arranging the phono-jack in accordance with the present invention, the use of output coupling capacitors is eliminated while retaining excellent click and pop performance, and the required output level is automatically adjusted. An overview of the present invention is shown in FIG. 2.

Figure 2:
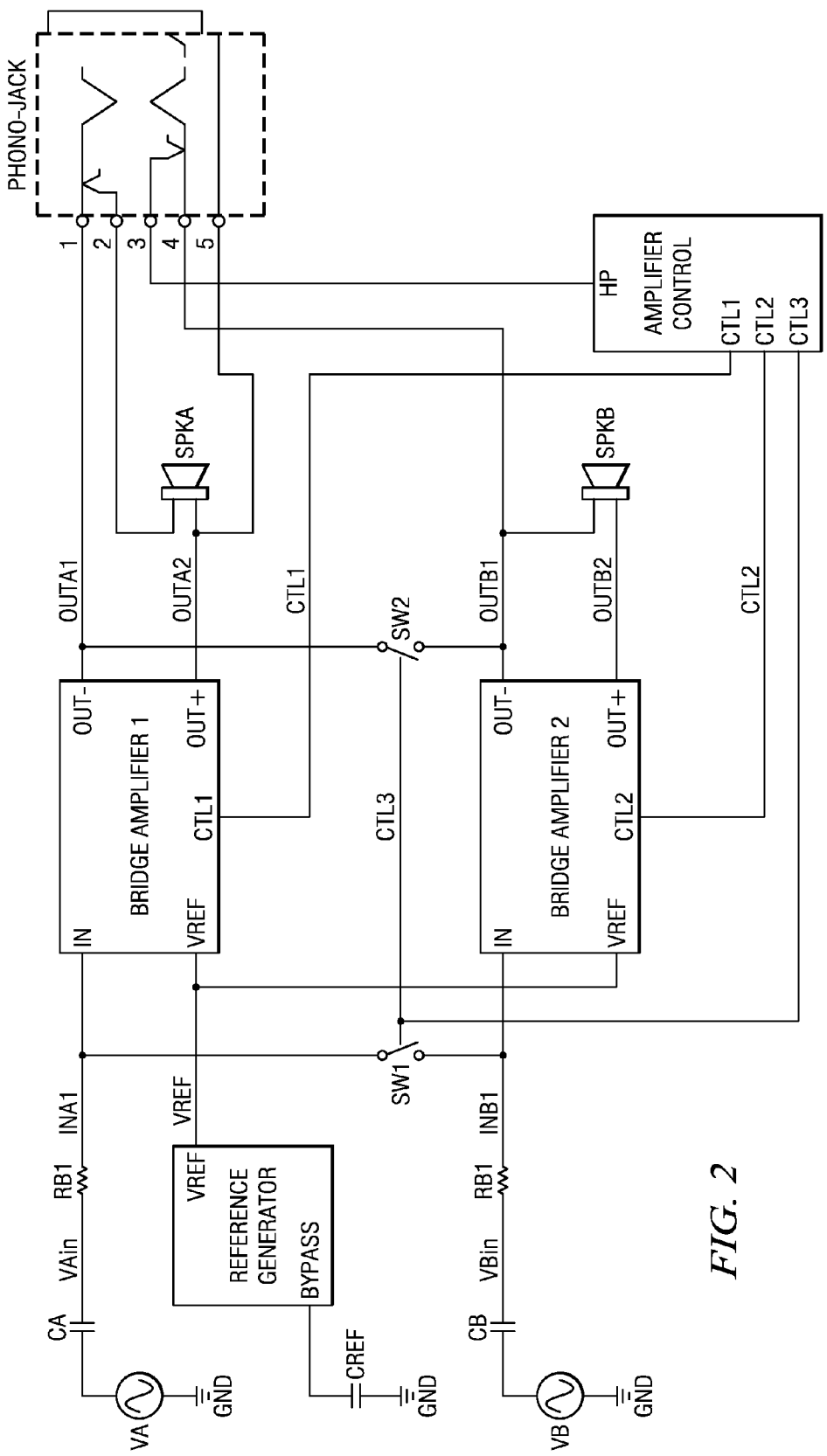
FIG. 2 is a schematic diagram of a configurable bridge amplifier in accordance with the present invention.

FIG. 2 shows a schematic diagram of a two-channel (A,B channels) amplifier in accordance with the present invention. The amplifier arrangement includes: two bridge amplifiers (one for each channel), a reference generator, an amplifier control, a phono-jack, and various controlled switches and capacitors. One channel (A) has an input signal (VA) that is AC coupled through a capacitor (CA) to the input of a bridge amplifier, providing a signal (V Ain). V Ain is connected through a series resistor (RA1) to the IN port of BRIDGE AMPLIFIER 1. Another channel (B) has an input signal (VB) that is AC coupled through a capacitor (CB) to the input of the other bridge amplifier, providing a signal (VBin). VBin is connected through a series resistor RB1 to the IN port of BRIDGE AMPLIFIER 2. Each bridge amplifier produces a first output signal (OUT+) and a second output signal (OUT−) in response to the amplifier's respective input signals.

A reference generator (REFERENCE GENERATOR) provides a reference voltage (VREF) for each of the bridge amplifiers through their respective VREF input ports. The REFERENCE GENERATOR also has another port (BYPASS) that is connected to a capacitor (CREF). The capacitor assists in providing a stable reference voltage in the reference generator.

The amplifier arrangement includes a set of control signals (CTL1, CTL2, CTL3) that are generated by a control circuit (AMPLIFIER CONTROL). BRIDGE AMPLIFIER 1 is connected to CTL1, while BRIDGE AMPLIFIER 2 is connected to CTL2. CTL3 is used to control two switches (SW1, SW2). The first switch (SW1) is arranged to short the IN terminals of the two amplifiers (V Ain, VBin) together when activated. The second switch (SW2) is arranged to short the OUT− terminals of the two amplifiers (OUTA1, OUTB1) together when activated.

One example of a headphone jack (PHONO-JACK) that may be used in the present invention is shown in FIG. 2. A stereo headphone includes a tip portion, a center portion (ring), and a rear portion (sleeve). The headphone jack includes five connection terminals numbered 1-5. Terminal 4 is connected to a first contact, for contacting the tip portion of a headphone plug, when inserted in the jack. Terminal 1 is connected to a second contact for contacting the ring portion of a headphone plug, when inserted in the jack. Terminal 5 is connected to a third contact, for contacting the sleeve portion of a headphone plug when inserted in the jack. Terminal 2 is connected to a fourth contact that contacts the first contact when no headphone is plugged in to the jack, and is out of contact with the first contact when a headphone is plugged in to the jack. Terminal 3 is connected to a fifth contact that contacts the second contact when no headphone is plugged in to the jack, and is out of contact with the second contact when a headphone is plugged in to the jack.

OUTA1 is coupled to terminal 1 of the phono-jack, while OUTA2 is coupled to terminal 5. A first speaker (SPKA) is connected between OUTA2 and terminal 2 of the phono-jack. Since terminal 2 is short-circuited to terminal 1 when no phono-plug is inserted, the speaker is effectively connected between the OUTA1 and OUTA2 terminals of BRIDGE AMPLIFIER 1. However, when a phono-plug is inserted into the phono-jack, the connection between terminals 1 and 2 of the phono-jack is broken and the first speaker (SPKA) will effectively be disconnected from the amplifier due to the open circuit condition. OUTB1 is coupled to terminal 4 of the phono-jack. A second speaker (SPKB) is connected between OUTB1 and OUTB2. Terminal 3 of the phono-jack is connected to the HP terminal of AMPLIFIER CONTROL.

The AMPLIFIER CONTROL monitors various activities (not shown) in the individual bridge amplifiers, and configures the bridge amplifiers (not shown) based upon those conditions. The above described amplifier configuration has two operating modes, one for headphones (HEADPHONE MODE) and one for speakers (SPEAKER MODE). Also, the amplifier configuration has two operating conditions, startup and steady-state. The various modes of operation will become clear from the discussions and schematic diagrams that follow bellow.

Bridge Amplifier 1—Configuration

Figure 1A:
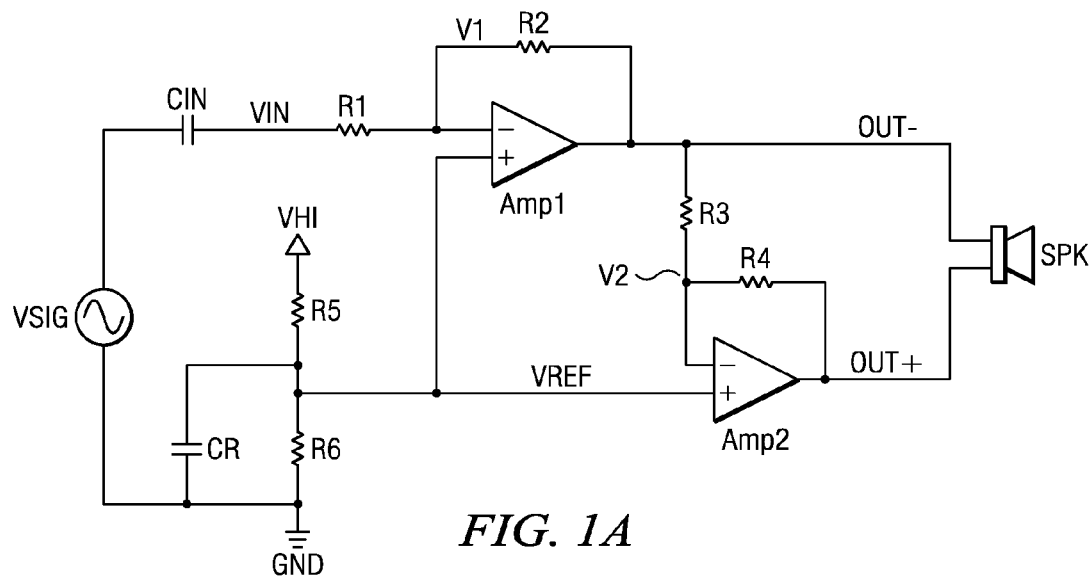
FIG. 1A is a schematic diagram of a bridge amplifier circuit.
Figure 1B:
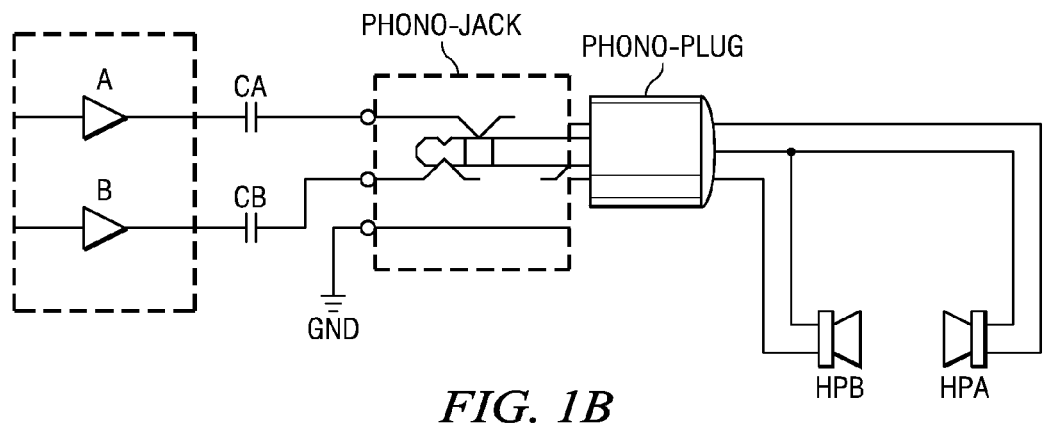
FIG. 1B a schematic diagram of a phono-plug engaged with a phono-jack in an AC coupled output headphone amplifier.
Figure 3:
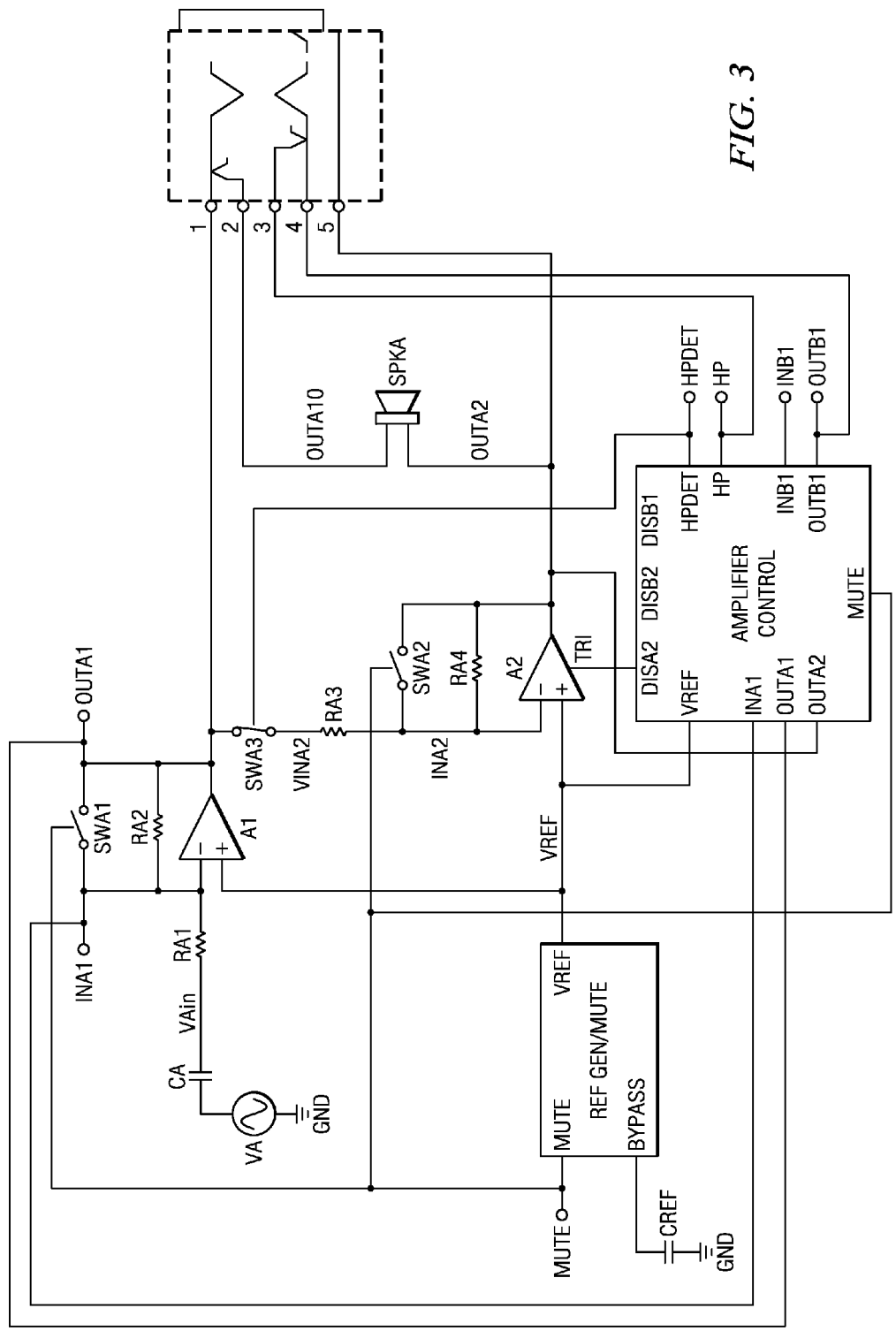
FIG. 3 is a schematic diagram of the first bridge amplifier shown in FIG. 2 and related circuits in accordance with the present invention.

A detailed schematic of BRIDGE AMPLIFIER 1 from FIG. 2 is shown in FIG. 3, with additional related components. The reference generator from FIG. 1 is replaced by REF GEN/MUTE, which includes an additional output signal (MUTE). The amplifier control from FIG. 1 is replaced by a more detailed amplifier control, including input ports INA1, OUTA1, OUTA2, INB1, OUTB1, MUTE, HP, VREF, and output ports HPDET, DISA2, DISB1, and DISB2. The signals INB1, OUTB1, DISB1 and DISB2 will be discussed later. BRIDGE AMPLIFIER 1 has been replaced with a first operational amplifier (A1), a second operational amplifier (A2), resistors RA1, RA2, RA3, RA4, controlled switches SWA1, SWA2, SWA3.

The first operation amplifier (op-amp A1) has a non-inventing input connected to VREF, an inverting input connected to INA1, and an output connected to OUTA1. Resistor RA1 is connected between the input signal (V Ain) and INA1. Resistor RA2 is connected between INA1 and OUTA1. Switch SWA1 is connected in parallel with resistor RA2, and controlled by the MUTE signal. Op-amp A1 is configured as an inverting amplifier, with a gain determined by resistors RA1 and RA2, and the state of switch SWA1. When switch SWA1 is closed, the inverting input is short-circuited to the output of the op-amp, configuring the op-amp as a unity-gain buffer that buffers VREF. When switch SWA1 is open, the op-amp functions as an inverting amplifier with a gain set by the resistor values (RA1, RA2).

The second op-amp (A2) has a non-inverting input connected to VREF, an inverting input connected to INA2, an output connected to OUTA2, and a tri-state control pin (TRI) connected to the DISA2 terminal of the amplifier controller. Resistor RA3 is connected between VINA2 and INA2. Resistor RA4 is connected between INA2 and OUTA2. Switch SWA2 is connected in parallel with resistor RA4, and controlled by the MUTE control signal. Switch SWA3 is series connected between the output (OUTA1) of the first op-amp (A1) and node VINA2. Switch SWA3 is controlled by the HPDET signal. When switch SWA3 is open, the second op-amp (A2) is isolated from the first op-amp (A1) and essentially acts as a voltage follower producing VREF at OUTA2. When switch SWA3 is closed and SWA2 is open, op-amp A2 is configured as an inverting amplifier with a gain determined by resistors RA3 and RA4. When switch SWA3 and SWA2 are closed, the inverting input is short-circuited to the output of the op-amp (A2), configuring the op-amp as a unity-gain buffer that buffers VREF.

AMPLIFIER CONTROL monitors the inputs and outputs of op-amps A1 and A2, the MUTE signal, and the status of the headphone jack (HP). In response to these and other signals, AMPLIFIER CONTROL generates HPDET, DISA2 and DISB2. The AMPLIFIER CONTROL sets op-amp A2 in a high-impedance mode (tri-state) with control signal DISA2. The AMPLIFIER CONTROL sets op-amp B1 in a high-impedance mode (tri-state) with control signal DISB1. The AMPLIFIER CONTROL also sets op-amp B2 in a high-impedance mode (tri-state) with control signal DISB2. The tri-state mode for op-amps A2 and B1 and B2 will be discussed later.

Bridge Amplifier 1—Speaker Mode

BRIDGE AMPLIFIER 1 (as shown in FIG. 3) is operated in the SPEAKER MODE when no phono-plug inserted in the jack. The AMPLIFIER CONTROL circuit monitors the HP port and determines that no phono-plug is inserted when a short is detected short between terminals 3 and 4 of the phono-jack. In the SPEAKER MODE, the AMPLIFIER CONTROL circuit sets the HPDET signal such that switch SWA3 is set in a closed-circuit position. While SWA3 is closed, the speaker (SPKA) is driven between signals OUTA1 and OUTA2. Since the op-amps (A1, A2) are configured as inverting amplifiers, OUTA1 and OUTA2 are inverted signals with respect to one-another. When RA3=RA4, OUTA1 and OUTA2 have equal magnitudes and opposite signs, resulting in a differential signal across SPK1 of 2*V(OUTA1), effectively producing four times the power of a single ended amplifier configuration.

Bridge Amplifier 2—Configuration

Figure 4:
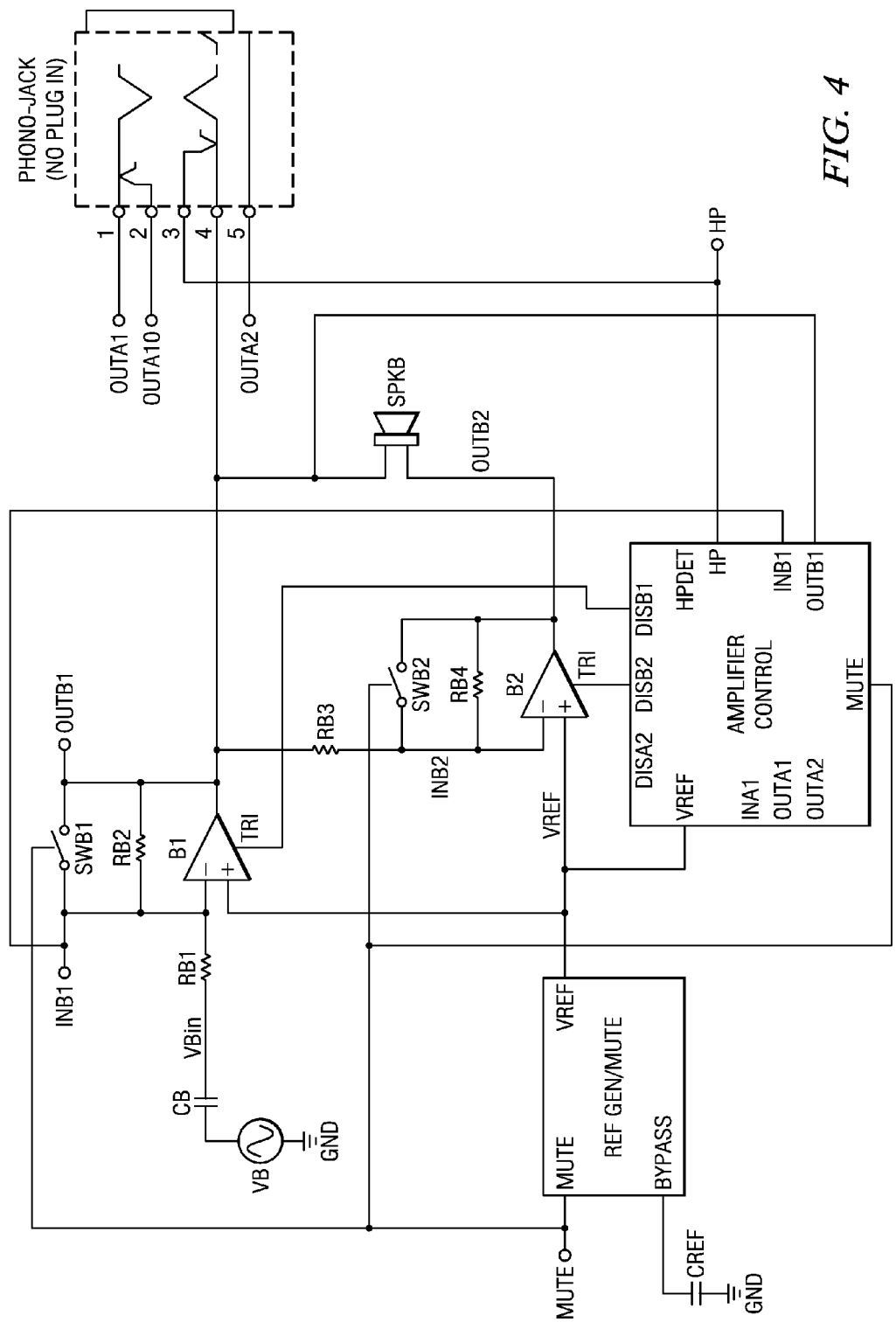
FIG. 4 is a schematic diagram of the second bridge amplifier shown in FIG. 2 and related circuits in accordance with the present invention.

A detailed schematic of BRIDGE AMPLIFIER 2 from FIG. 2 is shown in FIG. 4. BRIDGE AMPLIFIER 2 is similar to BRIDGE AMPLIFIER 1, which was discussed above. BRIDGE AMPLIFIER 2 is replaced with a first op-amp (B1), a second op-amp (B2), resistors RB1, RB2, RB3, RB4, and controlled switches SWB1 and SWB2.

The first op-amp (op-amp, B1) has a non-inverting input connected to VREF, an inverting input connected to INB1, an output connected to OUTB1, and a tri-state control pin (TRI) connected to the DISB1 terminal of the amplifier controller. Resistor RB1 is connected between the input signal (VBin) and INB1. Resistor RB2 is connected between INB1 and OUTB1. Switch SWB1 is connected in parallel with resistor RB2, and controlled by the MUTE signal. Op-amp B1 is configured as an inverting amplifier, with a gain determined by resistors RB1 and RB2, and the state of switch SWB1. When switch SWB1 is closed, the inverting input (INB1) is short-circuited to the output of the op-amp (OUTB1), configuring op-amp (B1) as a unity-gain buffer that buffers VREF. When switch SWB1 is open, op-amp B1 functions as an inverting amplifier with a gain set by the resistor values (RB1, RB2).

The second op-amp (B2) has a non-inverting input connected to VREF, an inverting input connected to INB2, an output connected to OUTB2, and a tri-state control pin (TRI) connected to the DISB2 terminal of the amplifier controller. Resistor RB3 is connected between OUTB1 and INB2. Resistor RB4 is connected between INB2 and OUTB2. Switch SWB2 is connected in parallel with resistor RB4, and controlled by the MUTE control signal. When switch SWB2 is closed, the inverting input (INB2) is short-circuited to the output (OUTB2) of op-amp B2, configuring the op-amp (B2) as a unity-gain buffer.

The AMPLIFIER CONTROL discussed previously, also monitors the inputs and outputs of op-amps B1 and B2. In response to these and other signals, AMPLIFIER CONTROL generates DISB1 and DISB2. The AMPLIFIER CONTROL sets BRIDGE AMPLIFIER 2 into either the SPEAKER MODE or HEADPHONE MODE of operation. The AMPLIFIER CONTROL in conjunction with the REF GEN/MUTE circuit also controls the configuration of BRIDGE AMPLIFIER 2 during start-up transients.

Bridge Amplifier 2—Speaker Mode

BRIDGE AMPLIFIER 2 (as shown in FIG. 4) is operated in the SPEAKER MODE when no phono-plug inserted in the phono-jack. A speaker (SPKB) is connected between the OUTB1 and OUTB2 terminals. OUTB1 is also connected to terminal 4 of the phono-jack. The AMPLIFIER CONTROL circuit monitors the HP port and determines that no phono-plug is inserted when a short is detected short between terminals 3 and 4 of the phono-jack as discussed previously.

In the SPEAKER MODE, under steady state conditions, the speaker (SPKB) is driven between signals OUTB1 and OUTB2. Since the op-amps (B1, B2) are configured as inverting amplifiers, OUTB1 and OUTB2 are inverted signals with respect to one-another. When RB3=RB4, OUTB1 and OUTB2 have equal magnitudes and opposite signs, resulting in a differential signal across SPKB of 2*V(OUTB1), effectively producing four times the power of a single ended amplifier configuration.

Bridge Amplifiers 1 and 2—Headphone Mode

When a phono-plug is inserted in the phono-jack, terminals 1 and 2 will be break from one another such that an open circuit condition exists between the two terminals. Similarly, terminals 3 and 4 will also break from one another. The AMPLIFIER CONTROL circuit monitors terminal 4 (HP) of the phono-jack and determines that the break indicates operation in the HEADPHONE MODE.

IN the HEADPHONE MODE, the AMPLIFIER CONTROL sets the HPDET signal such that switch SWA3 is set in an open-circuit position, isolating OUTA1 from VINA2. In this mode, OUTA1 functions as an inverting amplifier while OUTA2 functions as a virtual ground. As discussed previously, OUTA2 will produce a buffered voltage corresponding to VREF. Since op-amp A1 and op-amp A2 both have non-inverting terminals coupled to VREF, they will both have a DC output level corresponding to VREF.

The AMPLIFIER CONTROL sets the DISB2 signal active to set the second amplifier (B2) in BRIDGE AMPLIFIER 2 in tri-state. Since amplifier B2 has a very high impedance when in the tri-state mode, the second speaker (SPKB) is effectively disconnected from the circuit that is normally formed between the outputs of the amplifier B1 and B2 (nodes OUTB1 and OUTB2). Op-amp B1 is configured as an inverting amplifier for the second input signal (VBin). Since the non-inverting input of op-amp B1 is connected to VREF, the DC output level of amplifier B1 will also be VREF.

As discussed above, SPKA is disconnected from the output of the "A" channel amplifier by the break between terminals 1 and 2 of the phono-jack. SPKB is disconnected from the output of the "B" channel amplifier by the high-impedance state of amplifier B2. The output of the "A" channel amplifier is effectively OUTA1, while the output of the "B" channel amplifier is effectively OUTB1. The shield ring (terminal 5) of the phono-jack is driven by amplifier A2 to form a virtual ground with a potential set by VREF. Since the DC output levels of OUTA1 and OUTB1 are also VREF, the amplifiers (op-amps A1 and B1) do not drive DC currents through the load (i.e. headphones). The above-described circuit arrangements eliminate the use of output coupling capacitors while also eliminating DC loading on the amplifiers.

Start-Up Transients

Each op-amp shown in FIGS. 3 and 4 includes a non-inverting input coupled to VREF. VREF ideally is set to half of the supply voltage to ensure maximum signal swing in the op-amps. The op-amps will strive to equalize the voltages at the inverting and non-inverting inputs by driving the output voltages (OUTA1, OUTA2, OUTB1, OUTB2).

Input coupling capacitors (CA, CB) isolate the DC levels of the signal sources (VA, VB) from the DC levels of the inverting inputs (INA1, INB1) of amplifiers A1 and B1. As discussed previously, CREF is used to stabilize the reference voltage VREF. During initial power turn-on, the capacitors (CREF, CA, CB) are discharged to GND. After power turn-on, capacitors CA, CB and CREF must charge up to VREF.

Due to differences in impedances, component tolerances and other related circuit components, the capacitors (CREF, CA, CB) do not charge at the same rates. The difference in the charging rates causes a difference in the DC levels of the input terminals of the op-amps (INA1, VREF and INB1, VREF). Since the op-amps are configured with gain, the differences in the input terminals (i.e. INA1, VREF) are amplified and may appear in the speaker or headphone output signals. Non-audio signal differences in the input terminals of the op-amps cause clicks and pops in the output to the speaker or headphones.

Reference Generator and Mute Circuit

Figure 5:
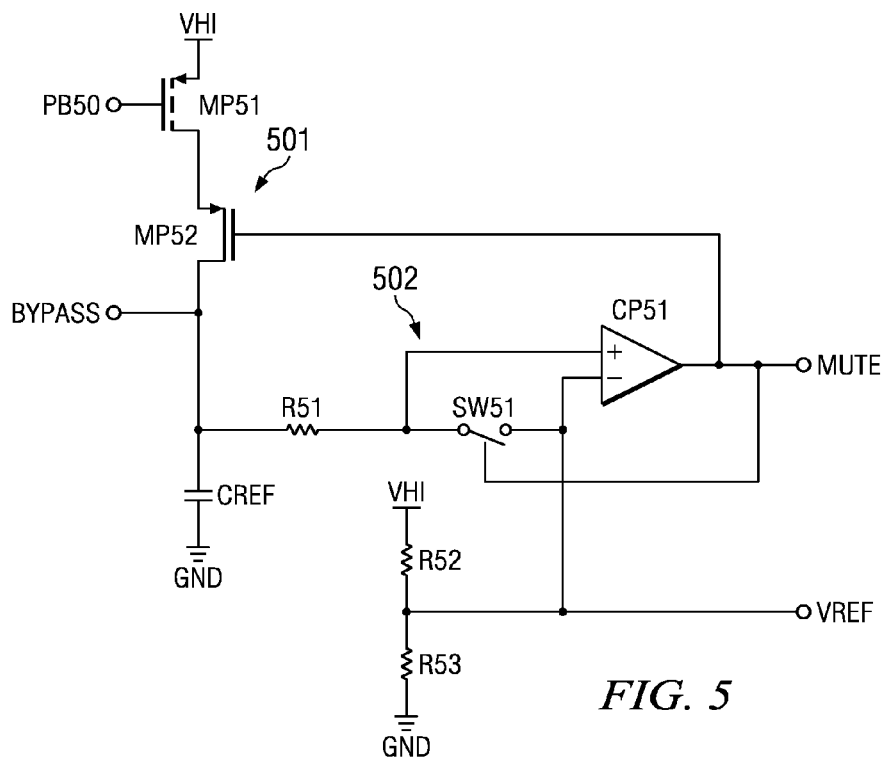
FIG. 5 is a schematic diagram of reference generator and mute control circuit (REF GEN/MUTE) shown in FIG. 2 in accordance with the present invention.

FIG. 5 shows a schematic diagram of the REF GEN/MUTE circuit shown in FIGS. 3 and 4. A reference voltage is provided at a terminal (VREF), while a mute signal is provided at another terminal (MUTE). As discussed earlier, CREF is connected between GND and BYPASS. A PMOS transistor (MP51) is configured as a current source with a gate connected to a bias line (PB51), a source connected to VHI (high power supply), and a drain connected to node 501. Another PMOS transistor (MP52) is configured as a switch with a gate connected to MUTE, a source connected to node 501, and a drain connected to BYPASS. A series resistor (R51) is connected between BYPASS and node 502. A comparator (CP51) has an inverting input connected to VREF, a non-inverting input connected to node 502, and an output connected to MUTE. A controlled switch (SW51) is connected between node 502 and VREF, and controlled by MUTE. A resistor (R52) is connected between VHI and VREF, while another resistor (R53) is connected between VREF and GND. When R52=R53, VREF is VHI/2 (half the supply voltage).

CP51 has a built-in offset such that shorting the inverting and non-inverting terminals together results in an output signal that is high (logic "H", VHI). During power up, capacitor CREF has no charge stored on it and thus has a voltage at ground. The comparator (CP51) is arranged to immediately start up with an output signal that is low (logic "L", GND). While MUTE is low, the switch SW51 is open-circuit and MP52 is conducting in an ON state. While MP52 is ON, current flows from the drain of MP51 through MP52 to the capacitor CREF. Since MP51 is biased at a fixed current, the capacitor (CREF) will charge at a constant rate. When the capacitor reaches the same voltage as VREF, the output (MUTE) of comparator CP51 will change to high (MUTE=VHI). When the MUTE signal becomes high, the gate of transistor MP51 is driven high and MP51 turns OFF (non-conducting state). Switch SW51 is closed once MUTE becomes high. Once switch SW51 has closed, the final voltage on CREF at the BYPASS node has been achieved and the capacitor (CREF) is coupled to the reference voltage (VREF).

Start-Up Transient Suppression—Speaker Mode

During the time interval where MUTE is low, switches SWA1, SWA2 (see FIG. 3), SWB1, and SWB2 (see FIG. 4) are closed. While SWA1 is closed, the inverting input (INA1) and output (OUTA1) of op-amp A1 are shorted together. Since the output will attempt to set the inverting and non-inverting inputs at the same voltage, op-amp A1 will drive current into the coupling capacitor (CA) until CA has charged to VREF. Similarly, when SWB1 is closed, the inverting input (INB1) and output (OUTB1) of op-amp B1 are shorted together, causing op-amp A2 to charge coupling capacitor CB to VREF.

As discussed previously, clicks and pops will be found in the output signal if a difference exists between the DC levels of INA1 and VREF (or INB1 and VREF). By either disconnecting a speaker, or maintaining OUT+ and OUT− at the same potential during startup, clicks and pops are dramatically reduced within tolerable limits (<40 mV for speakers, and <10 mV for headphones).

During the start-up transient period, the amplifier A2 is disabled by DISA2 and the first amplifier (A1) is configured as a buffer that buffers VREF (SWA1 closed by MUTE). Since amplifier A2 has a high output impedance in tri-state mode, the speaker (SPKA) is effectively disconnected from the circuit. As discussed previously, the first amplifier (A1) charges the input coupling capacitor (CA) towards a steady-state value corresponding to VREF. The AMPLIFIER CONTROL circuit detects when the MUTE signal has gone high, indicating that the final voltage has been charged on the CREF capacitor. Since speaker SPKA is disconnected during the start-up transient period, no clicks and pops are heard on the speaker during the start-up transient period.

Similar to amplifier A2, amplifier B2 is disabled by DISB2 and amplifier B1 is configured as a unity-gain follower (SWB1 closed by MUTE). Since B2 is has a high output impedance in tri-state mode, speaker SPKB is effectively disconnected form the circuit. Since speaker SPKB is disconnected during the start-up transient period, no clicks and pops are heard on the speaker during the start-up transient period.

While the MUTE signal is active (before CREF is fully charged), the AMPLIFIER CONTROL circuit maintains amplifiers A2 and B2 in tri-state. After CREF is charged to a steady-state voltage, amplifiers A2 and B2 are maintained in tri-state for an additional hold-off period. The additional hold-off period is required to permit capacitors CA and CB to charge up to their steady-state voltage (discussed later). After the hold-off period is over, amplifiers A2 and B2 are maintained in tri-state until an input signal is detected. When an input signal is detected in the amplifiers (discussed in further detail later), the AMPLIFIER CONTROL circuit enables amplifiers A2 and B2. Since the input audio signal is usually a large time-varying signal, enabling amplifiers A2 and B2 will produce an output signal without any noticeable click and pop.

Figure 8A:
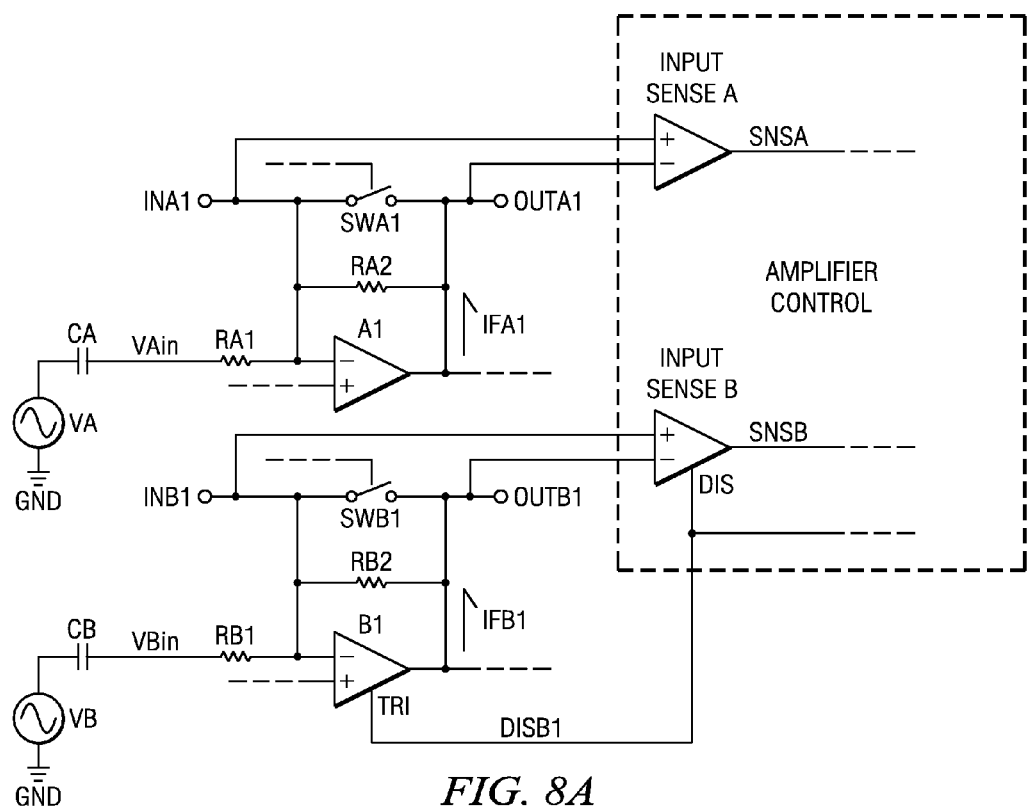
FIG. 8A is a schematic diagram showing the operation of the input sense circuits shown in FIG. 6 in accordance with the present invention.
Figure 8B:
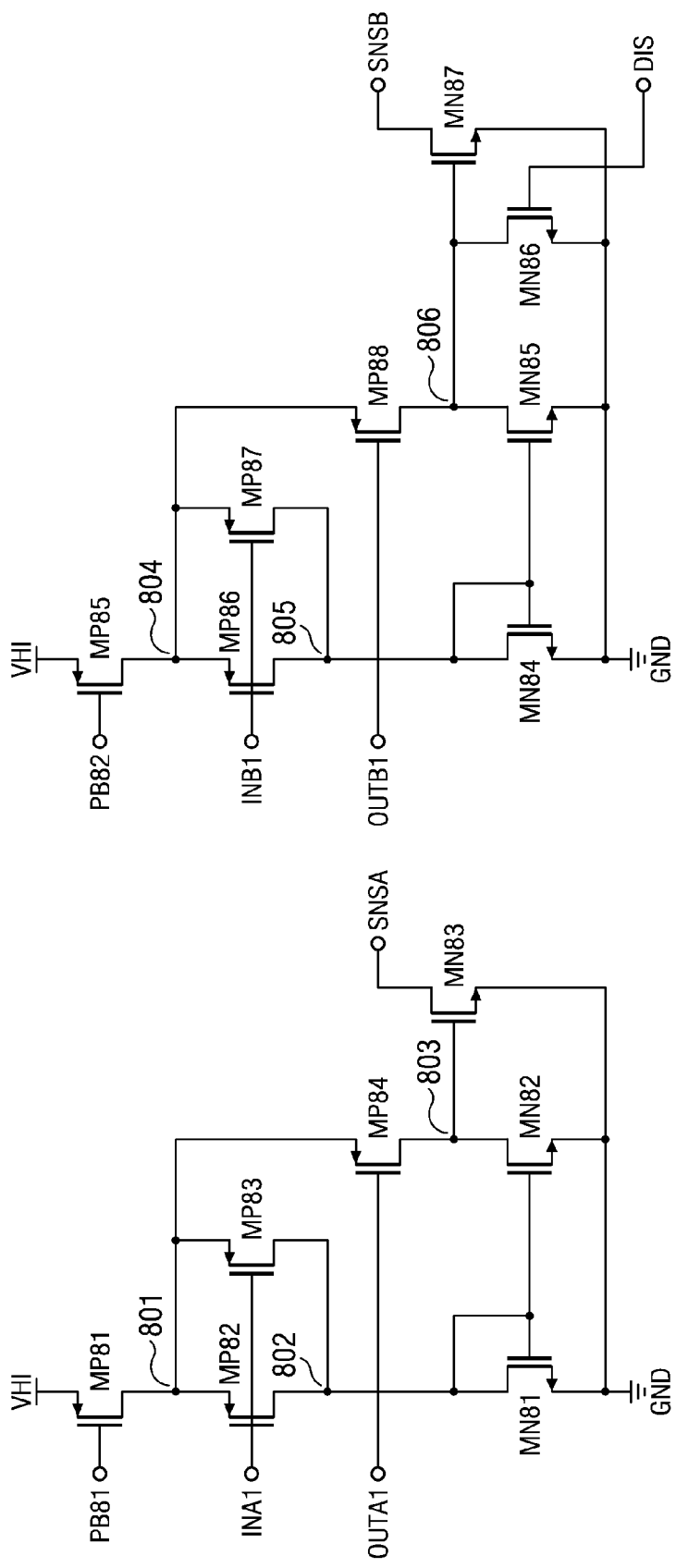
FIG. 8B is a schematic diagram showing an embodiment of the input sense circuits shown in FIG. 6 in accordance with the present invention.
Figure 8C:
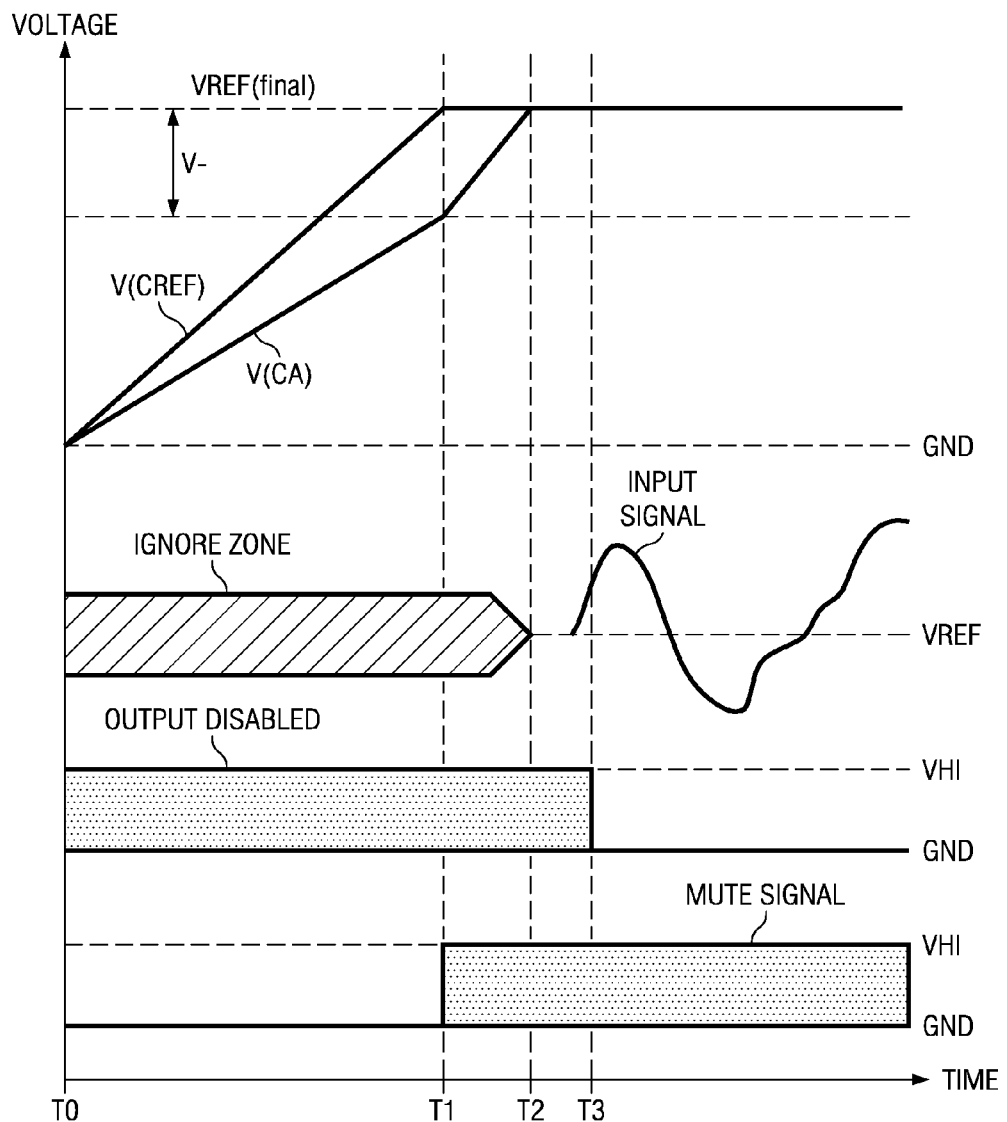
FIG. 8C is a graph showing various signals during operation of the present invention.

FIG. 8C shows the voltages stored on capacitors CREF and CA as V(CREF) and V(CA). The first transient time, where the MUTE signal maintains switch SWA1 as closed, is shown as times T0 through T1. At time T1, V(CREF) reaches a steady-state value of VREF(final) and the MUTE signal opens switch SWA1. However, at time T1, capacitor CA has not charged to the same potential as capacitor CREF. The difference in the voltages (.DELTA.V) is related to the transient response time of resistor RA1 and capacitor CA. Since the voltage output of the amplifier is driving into resistor RA1 at the INA1 node, the voltage of the CA capacitor lags behind the voltage on the CREF capacitor by the RC time constant of RA1 and CA. Once switch SWA1 opens, the difference in voltages is amplified by the gain of the first amplifier as set by resistors RA1 and RA2. The amplified (.DELTA.V) could cause a click and pop in the output signal to the speakers. To prevent the click and pop, the AMPLIFIER CONTROL circuit maintains the output of the amplifier system as disabled (i.e. for channel A, amplifier A2 remains in tri-state). From time T1 through T2, switch SWA1 is open and the capacitor CA charges rapidly due to the gain of amplifier A1 (as indicated by the changed slope). At time T2, amplifier A1 has fully charged capacitor CA (and amplifier B1 has charged CB) to a steady-state voltage corresponding to VREF.

A similar procedure applies to the channel B amplifier formed by op-amps B1 and B2. The channel B1 amplifier input is configured as a buffer during time T0 through T1 by maintaining switch SWA2 in the closed position. At time T1, SWA2 is opened (MUTE signal changes logic levels) and amplifier B1 is configured as an inverting amplifier. The charge on capacitor CB is rapidly charged to a steady-state voltage corresponding to VREF from time T1 through T2. At time T2, amplifier B1 has fully charged CB.

The AMPLIFIER CONTROL will detect the condition where both CA and CB have charged to their final voltage corresponding to VREF. At time T2 the AMPLIFIER CONTROL circuit determines that both coupling capacitors (CA and CB) have charged to their final voltage. At time T3 an input signal arrives at one of the input terminals (VAin, VBin). From time interval T0 through T3, the AMPLIFIER CONTROL circuit maintains amplifiers A2 and B2 in tri-state. After time T2 (when the input capacitors have charged), the AMPLIFIER CONTROL monitors the bridge amplifiers to determine when an input signal arrives. At time T3 when the input signal arrives, amplifiers A2 and B2 are enabled. To prevent an erroneous signal reading, the input signal must be greater than some threshold potential (i.e. 80 mV) before the AMPLIFIER CONTROL circuit will enable amplifiers A2 and B2. When amplifiers A2 and B2 are enabled, the input signal is of a sufficient size such that no noticeable click and pop will be detected in the output signals through the speakers. Since the AMPLIFIER CONTROL circuit monitors the voltage drop across the feedback resistor (RA2, RB2), the circuit design is independent of the size of the coupling capacitors (CA and CB) and the gain setting resistors (RA1, RA2, RB1, RB2).

Start-Up Transient Suppression—Headphone Mode

As discussed previously, the HEADPHONE MODE requires that amplifier A2 is configured as a buffer (SWA3 is open) providing a virtual ground, SPKA is disconnected from OUTA1, and SPKB is effectively disconnected from OUTB2 by tri-stating amplifier B2. However, during the start-up transients, amplifier A2 is set into a high output impedance mode (tri-state). Since, amplifier A2 is in tri-state, it is necessary to either ensure that the A1 and B1 amplifiers have the same output levels (no differential signal across the headphones), or to disconnected the output of at least one of amplifier A1 and B1. By either of these methods, we are assured that the headphones do not produce click and pop during the startup transient time.

During the start-up transient time, the AMPLIFIER CONTROL sets amplifiers A2, B1, B2 (see FIGS. 3 and 4) into tri-state mode to disable any transient signals from passing through the headphones. The AMPLIFIER CONTROL also sets switches SW1 and SW2 (see FIG. 2) to the closed position. Since SW1 shorts the input terminals of the bridge amplifiers together, and amplifier A1 is connected as a unity-gain amplifier (SWA1 is closed), amplifier A1 will drive current into the input coupling capacitors CA and CB. When switch SWA1 is opened by the MUTE signal, the reference voltage (VREF) has achieved a steady-state voltage as discussed previously with respect to the speaker mode operation.

Referring again to FIG. 8C, a first transient time is from time T0 to T1. During the first transient time, the MUTE signal maintains SWA1 and SWA2 in the closed position. At time T1, the reference voltage achieves a steady-state voltage and the MUTE signal opens switches SWA1 and SWA2. When switches SWA1 and SWA2 are open, amplifiers A1 and B1 are configured as inverting amplifiers. After time T1, the AMPLIFIER CONTROL circuit maintains amplifiers A2 and B1 in tri-state until the input coupling capacitors (CA and CB) have fully charged to their steady-state value (time T2), and an input signal is detected (time T3).

Once the start-up transients have reached their steady-state conditions (time T2) on all of the capacitors (CA, CB and CREF), and the input signal is detected (time T3), amplifiers A2 and B1 are enabled and switches SW1 and SW2 are opened. SW2 shorts the output terminals of the bridge amplifiers (OUTA1, OUTB1) together during the start-up interval (T0-T3), OUTA1 and OUTB1 are at the same potential. Since the steady-state voltage of the capacitors (CA, CB and CREF) correspond to VREF, the DC level of the headphone amplifier outputs (OUTA1, OUTB1) will be at a value also corresponding to VREF.

Amplifier Control Circuit

Figure 6:
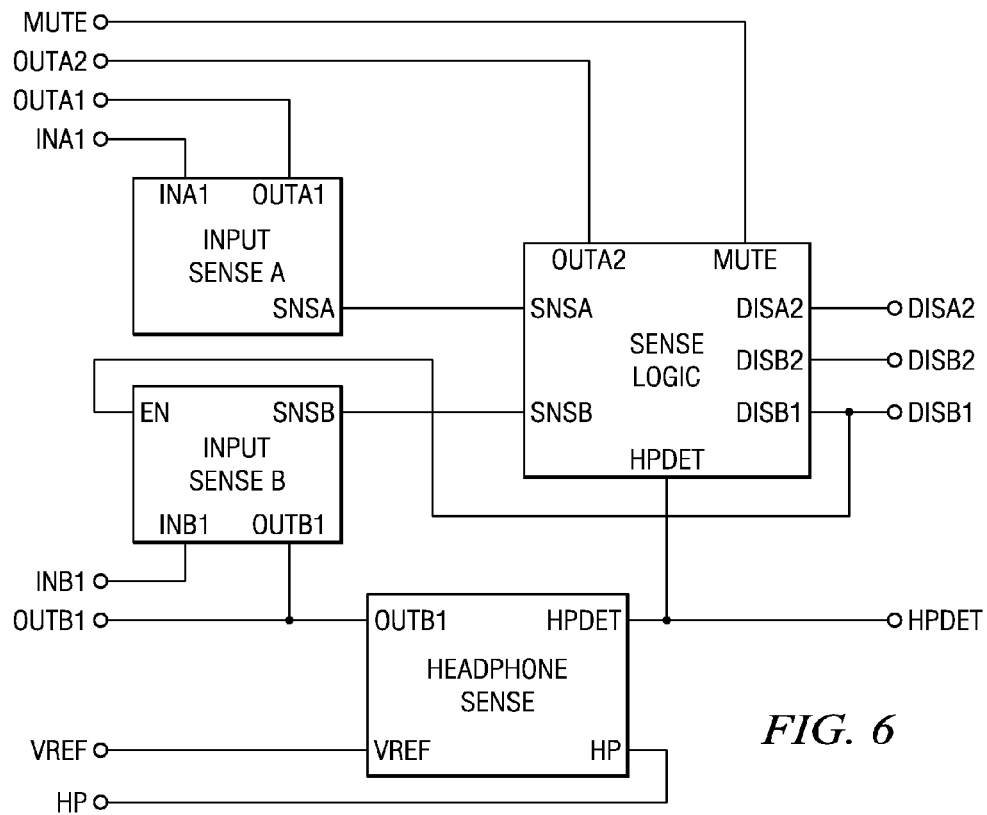
FIG. 6 is a schematic diagram of an embodiment of the AMPLIFIER CONTROL circuit shown in FIG. 2 in accordance with the present invention.

A block diagram of the AMPLIFIER CONTROL circuit is shown in FIG. 6. The AMPLIFIER CONTROL circuit includes circuits: INPUT SENSE A, INPUT SENSE B, HEADPHONE SENSE and SENSE LOGIC. The INPUT SENSE A circuit monitors the INA1 and OUTA1 signals to produce a signal SNSA. The INPUT SENSE B circuit monitors the INB1 and OUTB1 signals to produce a signal SNSB. The HEADPHONE SENSE circuit monitors the headphone connection HP, VREF and OUTB1, and produces a signal (HPDET) when it is determined that a phono-plug (i.e. headphone plug) has been inserted into the phono-jack. The SENSE LOGIC circuit monitors the signals SNSA, SNSB, OUTA2, MUTE, and HPDET to determine when to disable and enable amplifiers with the DISA2, DISB1 and DISB2 signals.

Headphone Sense Circuit

Figure 7:
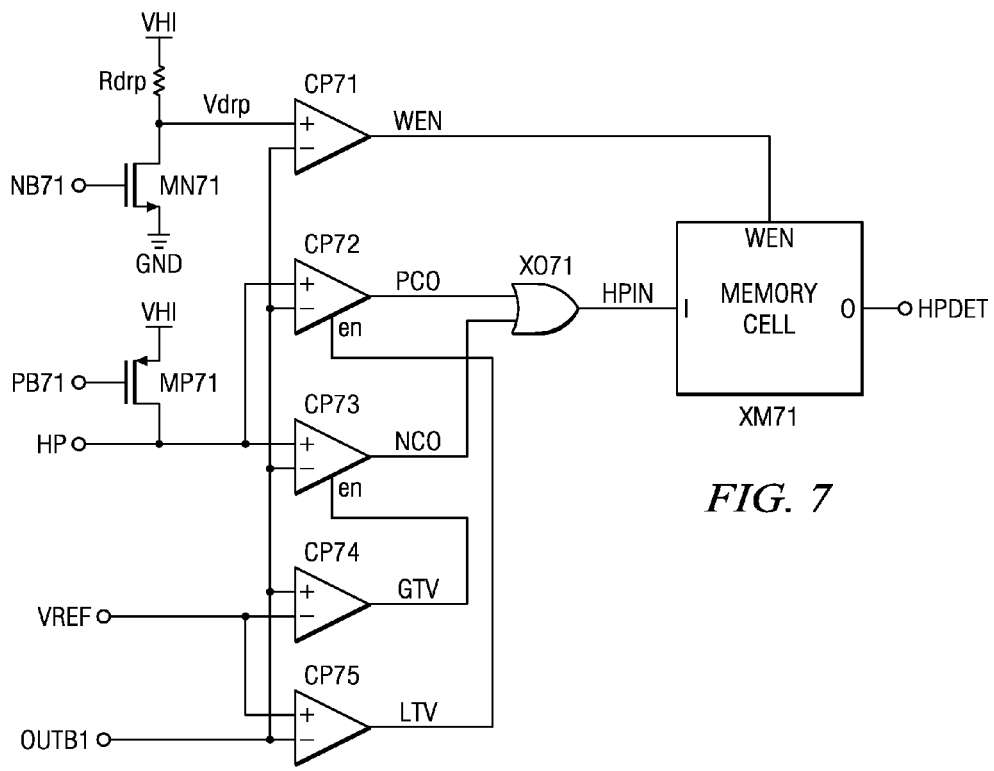
FIG. 7 is a schematic diagram of the HEADPHONE SENSE circuit shown in FIG. 6 in accordance with the present invention.

A detailed schematic of a HEADPHONE SENSE circuit is shown in FIG. 7. The HEADPHONE SENSE circuit includes: comparators CP71-CP75, an OR logic gate (XO71), a memory cell (XM71), resistor Rdrp, transistor MN71 and transistor MP71. Transistor MN71 has a gate connected to a bias line (NB71), a source connected to GND, and a drain connected to Vdrp. Resistor Rdrp is connected between VHI and Vdrp such that Vdrp corresponds to a fixed voltage drop from the VHI supply voltage (i.e. 0.4V drop). Comparators CP71-CP75 have inverting input terminals connected to OUTB1. Comparator CP71 has a non-inverting input terminal connected to Vdrp and an output connected to WEN. When the OUTB1 signal is lower than Vdrp, the write enable signal (WEN) is high (logic "1"). CP72 and CP73 have non-inverting input terminals connected to HP, and outputs PCO and NCO respectively. A pullup transistor (MP71) has a source connected to VHI, a drain connected to HP and a gate connected to PB71. CP74 has a non-inverting input connected to OUTB1, an inverting input connected to VREF, and an output connected to GTV. CP75 has a non-inverting input connected to VREF, an inverting input connected to OUTB1, and an output connected to LTV. LTV and GTV are enable lines for comparators CP72 and CP73 respectively. The OR (XO71) circuit produces an output (HPIN) based on inputs PCO and NCO. HPIN is connected to the input of the memory cell (XM71). The memory cell (XM71) stores the input (HPIN) when the WEN signal is high, and produces an output HPDET.

While no headphone plug is inserted into the headphone jack, OUTB1 operates as a bridge amplifier signal (OUT−), where HP and OUTB1 are shorted together through the mechanical connection between terminals 3 and 4 of the phono-jack. When a headphone plug (or any phono-type plug) is inserted into the phono-jack, HP (terminal 3) breaks from OUTB1 (terminal 4), and the voltage at HP begins to rise up to the VHI supply. CP72 is a comparator with a PMOS type input stage with a common mode range down to GND, while CP73 is a comparator with an NMOS type input stage having a common mode range up to VHI. Signal GTV is high when OUTB1 is greater than VREF. Signal LTV is high when OUTB1 is less than VREF. Comparators CP74 and CP75 enable comparators CP73 and CP72 respectively when the HP signal is pulled up to VHI, and OUTB1 is less than VHI by an amount indicated by Vdrp.

The write enable line (WEN) is not active unless Vdrp exceeds OUTB1. Thus, the memory cell will not be written to unless the OUTB1 signal is below VHI by a fixed amount (i.e. 0.4V). Once the memory cell is write-enabled, the output of comparators CP72 and CP73 will determine when the HPDET signal changes logic states. CP72 and CP73 together make a rail-to-rail comparator. When the HPDET signal changes to a logic level "1", the headphone plug has been detected as inserted.

False headphone detections are avoided by the circuit arrangement shown in FIG. 7. When we are in the speaker mode of operation, it is possible that the signal coming out of the B1 amplifier (OUTB1) reaches the VHI supply voltage. If the output of the comparators were used to directly determine when the headphone was inserted, the high level signal (OUTB1) would be mistaken as a headphone inserted condition. Comparator CP71 ensures that the memory cell is not enabled unless the signal is less than a predetermined amount (i.e. 400 mV), and thereby avoids false headphone detections.

Input Sense Circuits

FIG. 8A shows a schematic diagram showing the function of the input sense circuits (INPUT SENSE A and INPUT SENSE B) shown in FIG. 6. The first input sense circuit (INPUT SENSE A) is shown as a comparator, with a non-inverting input connected to INA1, an inverting input connected to OUTA1, and an output connected to SNSA. The second input sense circuit (INPUT SENSE B) is shown as a comparator, with a non-inverting input connected to INA1, an inverting input connected to OUTA1, a disable input (DIS) connected to DISB2, and an output connected to SNSB. The input sense circuits are arranged with an offset such that the outputs of the input sense circuits (SNSA and SNSB) will not indicate a signal detection when a zero volt difference is present across resistor RA2 and RB2 respectively (i.e. when MUTE closes switches SWA1 and SWB1).

The operation of the input sense circuits will be explained with reference to FIG. 8C. During transient T0 through T1, the MUTE signal causes switch SWA1 and SWB1 to close. The voltage on capacitor CREF is charged up to the steady-state voltage corresponding to VREF(final) at time T1. At time T1, the MUTE signal changes states, and causes switches SWA1 and SWB1 to open. Once SWA1 and SWB1 are open, depending on the headphone detection (HPDET) state, amplifiers A1 and B1 are configured as inverting amplifiers with a gain set by RA1, RA2 and RB1, RB2 respectively.

When in the headphone mode (HPDET is high), DISB1 is high (logic "1") and op-amp B1 and INPUT SENSE B are disabled. When INPUT SENSE B is disabled, only the output of INPUT SENSE A will be monitored. When in the speaker mode (HPDET is low), DISB1 is low (logic "0") and op-amp B1 and INPUT SENSE B are enabled. In the headphone mode, since SW1 is closed, an input signal on either the A or B channel will be detected by the INPUT SENSE A circuit (op-amp A1 operates as a summing amplifier).

For the speaker mode, the outputs of INPUT SENSE A and INPUT SENSE B are arranged such that a detected input signal on either channel A or B will cause a detected input signal result in the SENSE LOGIC shown in FIG. 6. In one embodiment of the invention, the outputs of INPUT SENSE A and INPUT SENSE B are wired OR outputs that are connected together. In another embodiment of the invention, logic connects the outputs of the input sense circuits to determine which circuits are monitored.

INPUT SENSE A includes an offset comparator. During transient period T0 through T1, INPUT SENSE A does not indicate a signal is present (i.e. logic 0) due to the offset of the comparator. During transient period T1 through T3, INPUT SENSE A measures the voltage drop across feedback resistor RA2 and monitors the direction of current IFA1 flowing based on the polarity of the voltage. From transient period T1 through T2, IFA1 flows from the output of amplifier A1 towards capacitor CA. Since the potential of OUTA1 is higher than INA1 during transient period T1 through T2, INPUT SENSE A is assisted in indicating that no signal is present. When the voltage drop across resistor RA2 has reached zero (IFA1=0 at time T2), capacitor CA has been fully charged to its final value (including any non-ideal effects from amplifier A1 and other circuits). Once amplifier A1 begins to operate normally (after time T2), an audio input signal applied to the V Ain input (or VBin when SW1 is closed) results in an increased current flow (IFA1) through feedback resistor RA2. As the input signal increases above VREF, the polarity of the voltage drop across RA2 changes such that the potential of INA1 is greater than the potential of OUTA1 (IFA1 flows from INA1 towards OUTA1). When the voltage drop across resistor RA2 exceeds the offset of the comparator (i.e. offset of 80 mV), the output (SNSA) of the comparator will change states (i.e. logic "1").

INPUT SENSE B is only active when DISB2 is low (logic "0", speaker mode). INPUT SENSE B also includes an offset comparator. During transient period T0 through T1, INPUT SENSE B does not indicate a signal is present (i.e. logic 0) due to the offset of the comparator. During transient period T1 through T3, INPUT SENSE B measures the voltage drop across feedback resistor RB2 and monitors the direction of current IFB1 flowing based on the polarity of the voltage. From transient period T1 through T2, IFB1 flows from the output of amplifier B1 towards capacitor CB. Since the potential of OUTB1 is higher than INB1 during transient period T1 through T2, INPUT SENSE B is assisted in indicating that no signal is present. When the voltage drop across resistor RB2 has reached zero (IFB1=0 at time T2), capacitor CB has been fully charged to its final value (including any non-ideal effects from amplifier B1 and other circuits). Once amplifier B1 begins to operate normally (after time T2), an audio input signal applied to the VBin input results in an increased current flow (IFB1) through feedback resistor RB2. As the signal increases above VREF, the polarity of the voltage drop across RB2 changes such that the potential of INB1 is greater than the potential of OUTB1 (IFB1 flows from INB1 towards OUTB1). When the voltage drop across the resistor RB2 exceeds the offset of the comparator (i.e. offset of 80 mV), the output (SNSB) of the comparator will change states (i.e. logic "1").

The outputs SNSA and SNSB are combined in the SENSE LOGIC circuit shown in FIG. 6. When both input sense circuits are enabled (DISB2=0), SNSA and SNSB are combined such that either one of the circuits may detect an input signal. When DISB2 is set high, only the SNSA signal is monitored to determine when an input signal has arrived. DISB2 is set high in headphone mode during transient time T0-T3.

In one embodiment of the invention, the input sense circuits include comparators with wired OR outputs as shown in FIG. 8B. INPUT SENSE A includes transistors MP81-MP84 and MN81-MN83. INPUT SENSE B includes transistors MP85-MP88 and MN84-MN87.

MP81 has a source connected to VHI, a gate connected to PB81 and a drain connected to node 801. MP82 and MP83 have gates connected to INA1, sources connected to node 801, and drains connected to node 802. MP84 has a gate connected to OUTA1, a source connected to node 801 and a drain connected to node 803. MN81 has a gate and drain connected to node 802 and a source connected to GND. MN82 has a gate connected to node 802, a drain connected to node 803 and a source connected to GND. MN83 is a wired OR output of the circuit, with a drain connected to SNSA, a gate connected to node 803 and a source connected to GND.

MP85 has a source connected to VHI, a gate connected to PB82 and a drain connected to node 804. MP86 and MP87 have gates connected to INB1, sources connected to node 804, and drains connected to node 805. MP88 has a gate connected to OUTB1, a source connected to node 804 and a drain connected to node 806. MN84 has a gate and drain connected to node 805 and a source connected to GND. MN85 has a gate connected to node 805, a drain connected to node 806 and a source connected to GND. MN86 has a gate connected to node DIS, a drain connected to node 806 and a source connected to GND. MN87 is a wired OR output of the circuit, with a drain connected to SNSB, a gate connected to node 806 and a source connected to GND.

Sense Logic Circuit

Figure 9:
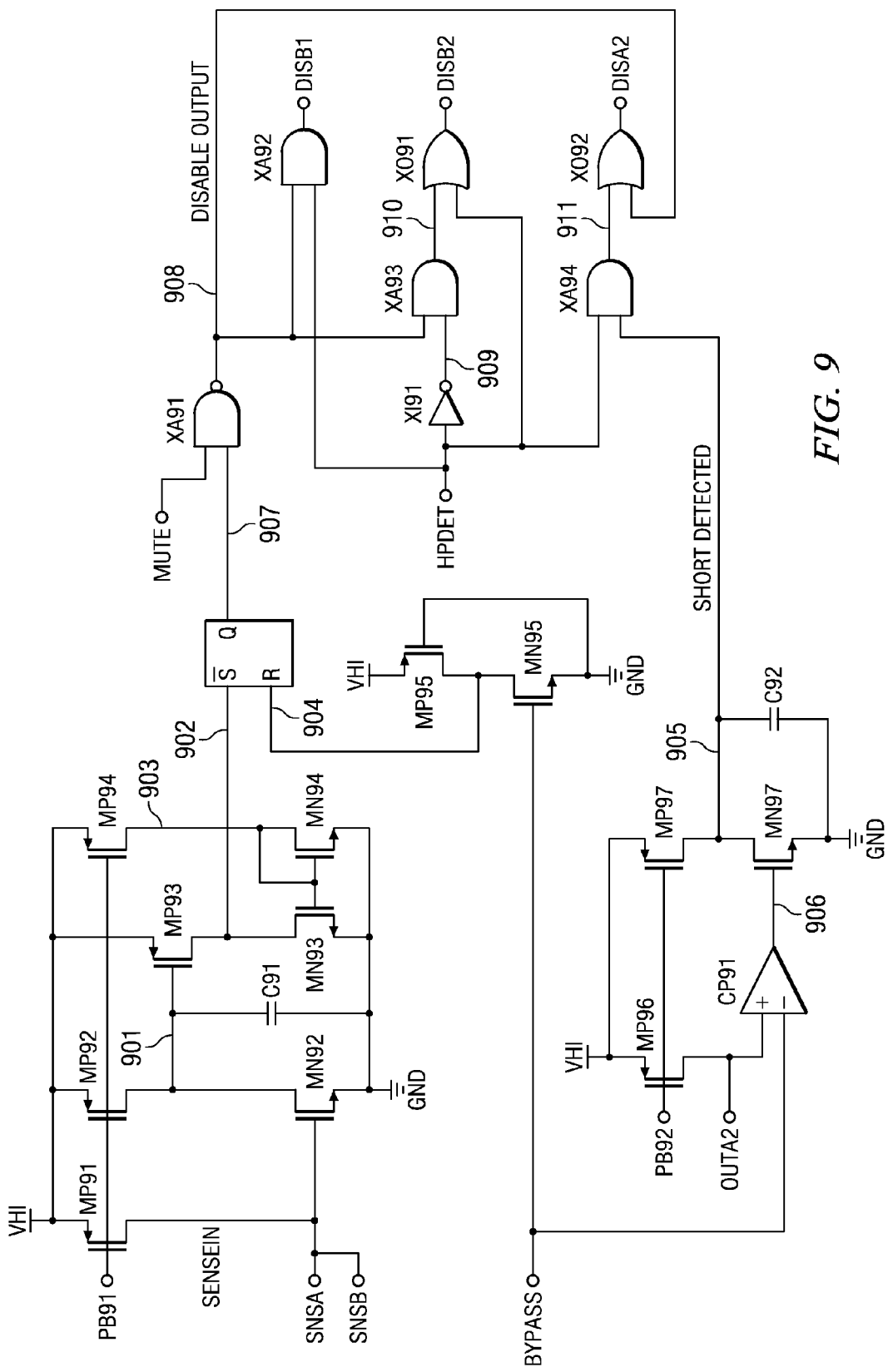
FIG. 9 is a schematic diagram showing an embodiment of the SENSE LOGIC shown in FIG. 6 in accordance with the present invention.

FIG. 9 is a detailed schematic of the SENSE LOGIC circuit shown in FIG. 6. The circuit includes a pull-up transistor MP91, a delay circuit (MP92-94, MN82-84, C91), a latch circuit, an output short-circuit detector (MP96-97, MN97, CP91, C92) and various related logic. This circuit includes pull-up transistor MP91 to permit wired OR logic outputs on SNSA and SNSB. It is understood and appreciated that other arrangements may be included to permit different types of outputs on the input sense circuits (INPUT SENSE A and INPUT SENSE B).

MP91 has a source connected to VHI, a drain connected to SENSEIN, and a gate connected to PB91. MP92 has a gate connected to PB91, a source connected to VHI and a drain connected to 901. MP93 has a source connected to VHI, a gate connected to node 901 and a drain connected to node 902. MP94 has a source connected to VHI, a gate connected to PB91 and a drain connected to 903. MN92 has a drain connected to 901, a gate connected to SENSEIN, and a source connected to GND. MN93 has a drain connected to 902, a gate connected to 903 and a source connected to GND. MN94 has a gate and drain connected to 903 and a source connected to GND. Capacitor C91 is connected between node 901 and GND.

BYPASS is connected to the gate of MN95 and the inverting input of comparator CP91. MN95 has a drain connected to 904 and a source connected to GND. MP95 has drain connected to 904, a gate connected to GND and a source connected to VHI. The latch has an active low set terminal connected to node 902, an active high reset line connected to node 904, and a Q output connected to node 907.

CP91 has a non-inverting input connected to OUTA2 and an output connected to 906. MP96 has a gate connected to PB92, a drain connected to OUTA2 and a source connected to VHI. MP97 has a gate connected to PB92, a drain connected to 905 and a source connected to VHI. MN97 has a gate connected to node 906, a drain connected to 905 and a source connected to GND. Capacitor C9 is connected between 905 and GND.

A NAND logic gate (XA91) has a first input connected to MUTE, a second input connected to node 907 and an output connected to node 908 (DISABLE OUTPUT). A first AND logic gate (XA92) has a first input connected to node 908 and a second input connected to HPDET, and an output connected to DISB1. An inverter gate (XI91) has an input connected to HPDET and an output connected to node 909. A second AND logic gate (XA93) has a first input connected to node 908, a second input connected to node 909, and an output connected to node 910. A first OR gate (XO91) has a first input connected to node 909, a second input connected to HPDET, and an output connected to DISB2. A third AND logic gate (XA94) has a first input connected to HPDET, a second input connected to node 905 (SHORT DETECTED), and an output connected to node 911. A second OR logic gate (XO92) has a first input connected to node 911, a second input connected to node 908, and an output connected to node DISA2.

Operation of SENSE LOGIC

At initial power up, BYPASS is at the same potential as GND. MP95 is appropriately sized to act as a resistor connected to the drain of MN95. As capacitor CREF charges up towards VREF, transistor MN95 will become active, pulling node 904 down towards the potential of GND. Since node 904 is connected to R of the latch, the latch will be reset during this power up period.

The SNSA and SNSB inputs are wired as OR logic to SENSEIN. When either one of the sense signals detects current flowing as described previously, the SENSEIN line is pulled low, causing transistor MN92 to turn off. Since capacitor C91 is connected to node 901, the voltage change at node 901 will be delayed. MP92 will slowly charge capacitor C91 towards the VHI supply voltage. MP93 will shut off when the voltage at node 901 has risen above a threshold voltage away from the VHI supply, and node 902 will drop towards GND due to biased transistor MN93. Once node 902 has dropped sufficiently low, the latch will set node 907 to logic high. Since changes in node 902 are delayed by capacitor C91, the latch will not be set by a false signal (i.e. noise on the input).

The MUTE signal is logic low when capacitor CREF is not charged to its final value. When the MUTE signal has a logic high signal, indicating that capacitor CREF is charged, node 908 (OUTPUT DISABLED) remains high until the output of the latch is also logic high. When both the output of the latch and the mute signals are high, node 908 drops low indicating that the output of the amplifier system can be enabled (signal hold-off is complete).

When in the headphone mode (HPDET is high), the DISB2 signal is forced logic high (tri-stating op-amp B2) and the DISB1 signal will remain high (tri-stating op-amp B1) until the signal hold-off is complete (indicated by DISABLE OUTPUT dropping to a low logic level). When in the speaker mode (HPDET is logic low), the DISB2 signal will remain high (tri-stating op-amp B2) until the signal hold-off is complete.

Op-amp A2 will be disabled by a logic high signal on DISA2. There are two conditions in which op-amp A2 must be set into tri-state. First, op-amp A2 is always disabled when the circuit has not detected an input signal after transient start-up as indicated by DISABLE OUTPUT. Second, there is the possibility that when the system is placed in the headphone mode (HPDET is high) that GND may be connected to the shield ring connection of the phono-plug jack (terminal 5). Amplifier A2 is also disabled when this condition occurs.

Headphone jacks are sometimes used a line-out for driving another audio amplifier, or powered speaker. As discussed previously, when in the headphone mode, op-amp A2 drives phono-jack terminal 5 at a potential serving as a virtual ground (VGND). The virtual ground is determined by the potential of VREF. When terminal 5 is externally shorted to another potential that has a common ground connection with the present invention (GND), the output of amplifier A2 will be forced to a new potential. CP91 compares the voltage at capacitor CREF (BYPASS) to the potential at terminal 5 of the phono-jack (OUTA2). When the phono-jack forces terminal 5 to a low potential commonly grounded to the present circuit, comparator CP91 outputs a low potential to node 906, turning off transistor MN97. If the short condition persists long enough, the capacitor (C92) connected to node 905 will be charged up to VHI indicating a short is detected (SHORT DETECTED), and setting op-amp A2 in tri-state (DISA2 logic high). If the plug is subsequently removed from the jack, pull-up transistor MP96 increases the output voltage of OUTA2 sufficient to enable op-amp A2.

Current Limit Outputs

Figure 10:
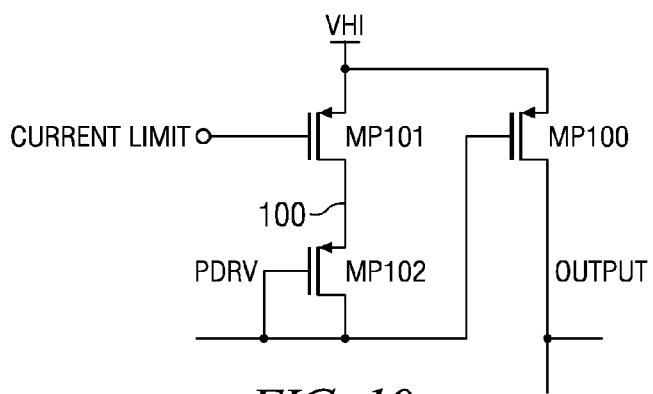
FIG. 10 is a schematic diagram showing an embodiment of an amplifier output limit circuit in accordance with the present invention.

Op-amps A1, A2, and B1 may be operated with a current limited output stage as shown in FIG. 10. A PMOS output stage transistor (MP100) has a gate connected to PDRV, a source connected to VHI, and a drain connected to the OUTPUT. MP101 has a source connected to VHI, a drain connected to node 100, and a gate connected to signal Current Limit. MP102 has a source connected to node 100, and a gate and drain connected to PDRV. PMOS transistors MP101 and MP102 act as a dynamically controlled clamp circuit, clamping the voltage PDRV to roughly a diode drop away from VHI when activated. The current limit signal is an active low signal, such that MP101 switches on the clamp when Current Limit is a logic low signal. In one embodiment, the current limit signal may be connected to an inverted version of HPDET such that when HPDET is high (indicating a headphone is plugged in), the clamp circuit is activated.

If the headphone amplifier is used as a line output, then amplifiers A1, A2 and B1 are connected through the phonojack to an external circuit. The external circuit may excessively load the outputs of these amplifiers. The short-circuit protection circuit limits the current output of amplifiers A1, A2 and B1 accordingly.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An apparatus for monitoring a jack for a plug insertion, the jack having a first terminal driven by a signal and a second terminal that is separably coupled to the first terminal, the second terminal of the jack is decoupled from the first terminal when a plug is inserted into the jack, comprising:
   a first circuit that couples a supply voltage to the second terminal when the plug is in the jack;
   a compare circuit that generates a compare signal responsive to a comparison of the signal to a potential of the second terminal;
   an enable circuit that generates an enable signal when the signal is determined to be different from the supply voltage by a predetermined amount; and
   a memory circuit that stores the compare signal when enabled by the enable signal such that the memory circuit produces an output signal indicating the disposition of the plug in the jack.

2. An apparatus as in claim 1, wherein the first circuit includes a transistor that is biased to provide a path between the power supply voltage and the second terminal.

3. An apparatus as in claim 1, wherein the enable circuit further comprises:
   a first reference voltage circuit that generates a first reference voltage that is different from the power supply voltage by a predetermined amount; and
   a first comparator circuit that compares the signal to the first reference voltage to generate an enable signal, the enable signal indicating that the signal different from the power supply voltage by at least the predetermined amount.

4. An apparatus as in claim 1, wherein the compare circuit produces a first output when the potential of the signal is the same as the potential of the second terminal, and the compare circuit produces a second output when the potential of the signal is different from the potential of the second terminal.

5. A method of monitoring a jack for a plug insertion, the jack having a first terminal driven by a signal and a second terminal that is separably coupled to the first terminal, the second terminal of the jack is decoupled from the first terminal when a plug is inserted into the jack, comprising:
   coupling the second terminal to a power supply voltage when the jack is inserted;
   generating a compare signal responsive to a comparison of the signal to a potential of the second terminal; and
   storing the compare signal in a memory when the signal is different from the power supply voltage by a predetermined amount.

6. An apparatus for monitoring a jack for a plug insertion, the jack having a first terminal driven by a signal and a second terminal that is separably coupled to the first terminal, the second terminal of a jack is decoupled from the first terminal when a plug is inserted into the jack, comprising:
   means for coupling the second terminal to a power supply voltage when the jack is inserted;
   means for generating a compare signal responsive to a comparison of the signal by a potential of the second terminal; and
   means for storing the compare signal in a memory when the signal is different from the power supply voltage by a predetermined amount.

* * * * *